(12) United States Patent
Chiba et al.

(10) Patent No.: US 7,492,176 B2
(45) Date of Patent: Feb. 17, 2009

(54) PROBER AND PROBE CONTACT METHOD

(75) Inventors: Kiyotaka Chiba, Tokyo (JP); Fumio Mase, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 12 days.

(21) Appl. No.: 11/776,516

(22) Filed: Jul. 11, 2007

(65) Prior Publication Data
US 2008/0018352 A1    Jan. 24, 2008

(30) Foreign Application Priority Data
Jul. 20, 2006    (JP)    ............................. 2006-197988

(51) Int. Cl.
*G01R 31/02*    (2006.01)
(52) U.S. Cl. .................. 324/758; 324/760; 324/765
(58) Field of Classification Search .................. None
See application file for complete search history.

(56) References Cited

U.S. PATENT DOCUMENTS 6,124,725 A * 9/2000 Sato ........................... 324/765

FOREIGN PATENT DOCUMENTS

| JP | 5-343485 | 12/1993 |
| JP | 11-26520 | 1/1999 |
| JP | 2001-210683 | 8/2001 |

OTHER PUBLICATIONS

Patent Abstracts of Japan, Publication No. 05-343485, Published on Dec. 24, 1993, in the name of Tsuta.
Patent Abstracts of Japan, Publication No. 11-026520, Published on Jan. 29, 1999, in the name of Akamatsu, et al.
Patent Abstracts of Japan, Publication No. 2001-210683, Published on Aug. 3, 2001, in the name of Chiba.

* cited by examiner

*Primary Examiner*—Vinh P Nguyen
(74) *Attorney, Agent, or Firm*—Christie, Parker & Hale, LLP

(57) ABSTRACT

A prober and a method for reducing errors in the contact position between a probe and an electrode without lowering throughput when conducting a test of a wafer at a high or low temperature. The prober includes a wafer chuck for holding a wafer, a movement mechanism for moving the wafer chuck, a temperature adjustment mechanism for adjusting the temperature of the wafer chuck to maintain the wafer at a predetermined temperature, an alignment mechanism for measuring a positional relationship between the electrode of the device of the wafer and the probe, a movement control section for calculating the amount of movement to touch the electrode to the probe based on the positional relationship between the electrode and the probe measured by the alignment mechanism and controlling the movement mechanism based on the calculated amount of movement and a wafer temperature sensor that detects the temperature of the wafer before it is held on the wafer chuck.

2 Claims, 5 Drawing Sheets

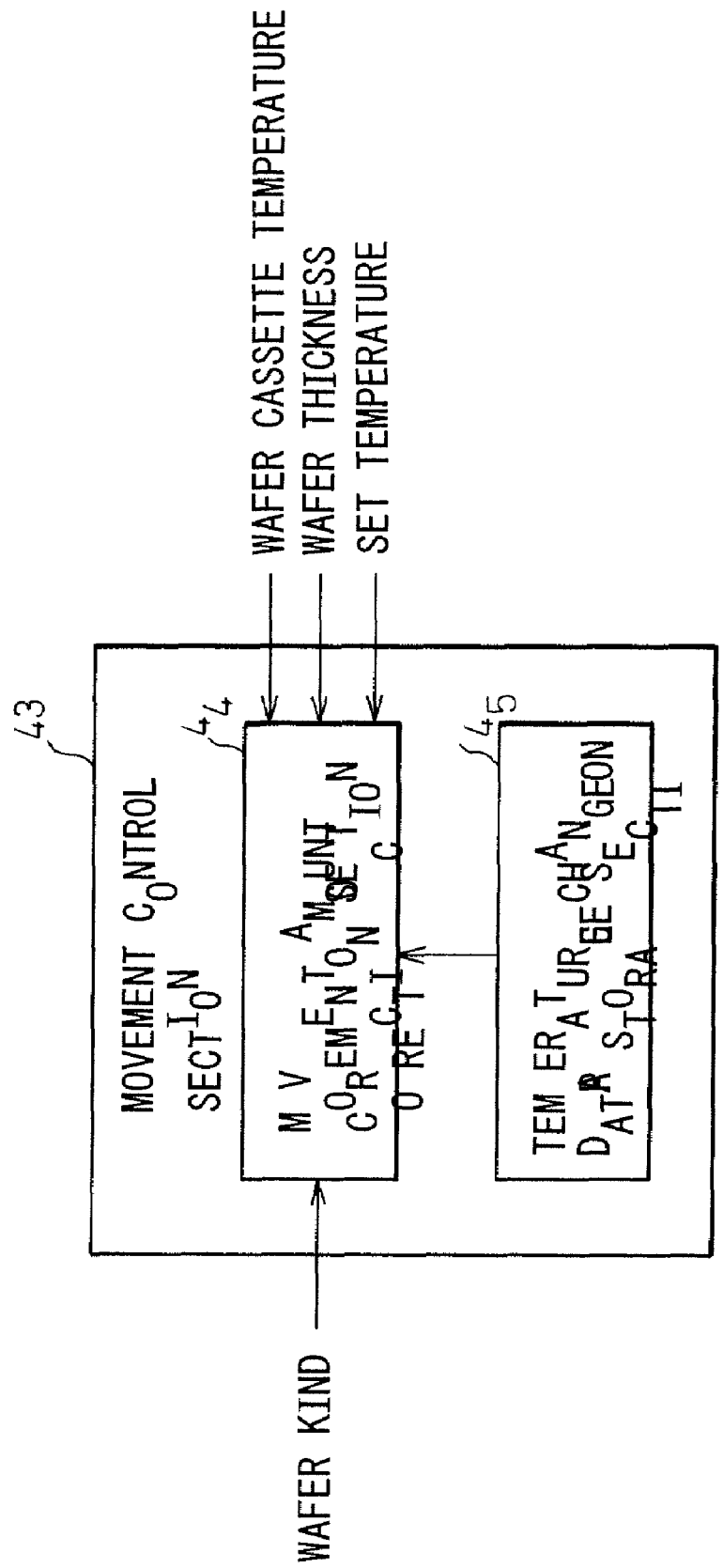

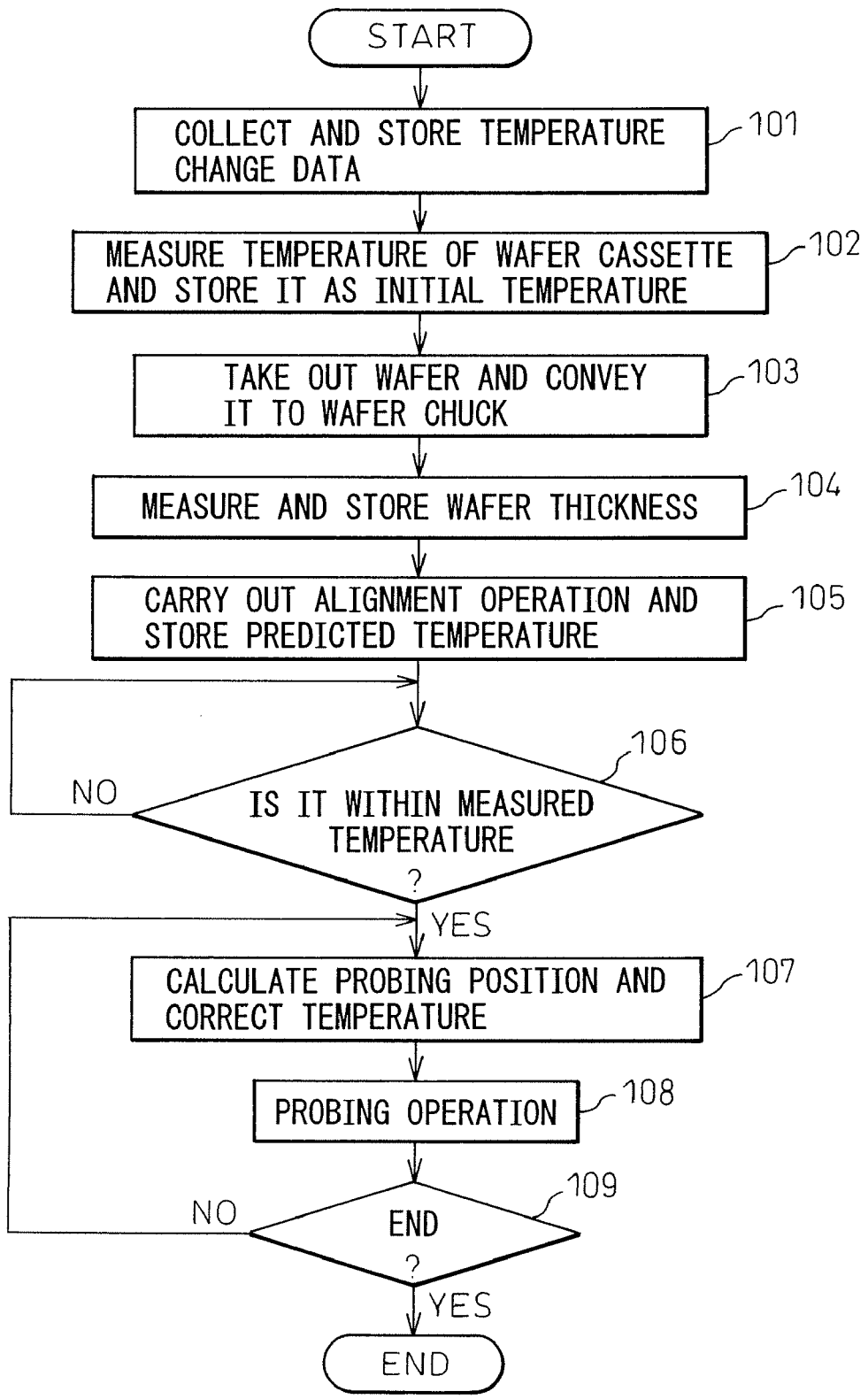

PROBER AND PROBE CONTACT METHOD

CROSS-REFERENCE TO RELATED APPLICATION

This application claims priority of Japanese Patent Application Number 2006-197988, filed on Jul. 20, 2006.

BACKGROUND OF THE INVENTION

The present invention relates to a prober that connects an electrode of a die to a probe to be connected to a terminal of a tester in order to conduct electrical inspection of a plurality of devices (dies) formed on a semiconductor wafer and a probe contact method for touching a probe to an electrode, and more particularly, to a prober that inspects a wafer while maintaining it at a high or low temperature and a probe contact method therefor.

In a semiconductor manufacturing process, a plurality of devices (dies) are formed by subjecting a thin disk-shaped semiconductor wafer to various processes. After the electrical characteristic of each device is inspected and the devices are separated using a dicer, they are fixed on a lead frame, etc., and then assembled. The above-mentioned inspection of the electrical characteristics are conducted by a wafer test system consisting of a prober and a tester. This inspection is referred to as a probing test. The prober holds a wafer on a stage and touches a probe to the electrode of each device. The tester supplies power and various test signals from a terminal connected to the probe and confirms whether the operation is normal by analyzing the signal output to the electrode of the device using the tester.

The semiconductor device is used for many purposes and some devices are used in a low or high temperature environment, and therefore, a prober is required to be capable of being subjected to inspection in such an environment. In order to cope with this, for example, a wafer temperature adjustment mechanism, such as a heater mechanism, chiller mechanism, etc., which changes the temperature of the surface of a wafer chuck, is provided under the wafer mount surface of a wafer chuck that holds a wafer in a prober and the wafer held on the wafer chuck is heated or cooled down.

FIG. 1 is a diagram showing a general configuration of a wafer test system comprising a prober having a wafer temperature adjustment mechanism. As shown schematically, a prober 10 has a base 11, a movement base 12 provided thereon, a Y axis movement base 13, an X axis movement base 14, a Z axis movement section 15, a Z axis movement base 16, a θ rotation section 17, a wafer chuck 18, an alignment microscope 19, supports 20 and 21, a head stage 22, a card holder 23 provided on the head stage 22, and a probe card 24 to be attached to the card holder 24. The probe card 24 is provided with a probe 25. The movement base 12, the Y axis movement base 13, the X axis movement base 14, the Z axis movement section 15, the Z axis movement base 16, and the θ rotation section 17 constitute a movement/rotation mechanism that moves and rotates the wafer chuck 18 in the directions of the three axes and around the Z axis. A movement control section 43 controls the movement/rotation mechanism. Since the movement/rotation mechanism is widely known, an explanation is omitted here. The probe card 24 has the probe 25 arranged in accordance with the arrangement of the electrodes of a device to be inspected and is exchanged in accordance with a device to be inspected. Although the needle alignment camera 19 that detects the position of the probe, a cleaning mechanism that cleans a probe, etc., are provided, they are omitted here.

A tester 30 has a test head 31 and a contact ring 32 provided at the test head 31. The probe card 24 is provided with terminals to be connected to the respective probes and the contact ring 32 has spring probes arranged so that they come into contact with the terminals. The test head 31 is held with respect to the prober 10 by a support mechanism (not shown). The prober 10 makes a measurement in connection with the tester 30 in a wafer test, however, its power supply system and mechanical sections are independent from the tester main body and the test head.

When conducting inspection, the tip position of the probe 25 is detected by the needle alignment camera (not shown). Next, in a state in which a wafer W to be inspected is held on the wafer chuck 18, the Z axis movement base 16 is moved so that the wafer W is situated under the alignment microscope 19 and the position of the electrode of the device on the wafer W is detected.

FIG. 2 is a diagram showing an array example of devices 1 formed on the wafer W, in which a great number of devices 1 are formed. As shown at the lower portion of FIG. 2, each device 1 has an electrode 2 for supplying electric power from the outside and inputting/outputting signals from/to the outside. In the prober, the electrode 2 of each device 1 comes into contact with the probe 25.

When the position of the electrode of the device is detected, it is not necessary to detect the positions of all of the devices 1, but only the positions of some electrodes. In addition, it is not necessary to detect the electrodes of all of the devices on the wafer W, but is only necessary to detect the positions of the electrodes of some devices. The above-described detection operation of the position of electrode on the wafer is referred to as a wafer alignment operation.

It is assumed that such a relationship between the position detected by the needle alignment camera and the position detected by the alignment microscope 19 is acquired in advance by, for example, touching the probe 25, the tip position of which has been detected by the needle alignment camera, to the surface of the wafer to detect the probe contact trace on the wafer using the alignment microscope 19.

After detecting the position of the probe 25 and the position of electrode of the wafer W, the wafer chuck 18 is rotated by the θ rotation section 17 so that the direction of the array of device electrodes coincides with the direction of the array of the probe 25. Then, after a movement is made so that the electrode of the device to be inspected of the wafer W is situated under the probe 25, the wafer chuck 18 is lifted so that the electrode comes into contact with the probe 25. These movement operations are controlled by the movement control section 43. Then, electric power and test signals are supplied to the electrode from the test head 31 via the contact ring 32 and whether the operation is normal is confirmed by detecting the signal output to the electrode.

The general configuration of the wafer test system is described as above. The prober, in which the wafer chuck is heated or cooled down and capable of conducting inspection while maintaining the held wafer W at a high temperature or low temperature, is provided with a heater 26 and a chuck cooling liquid path 27 within the wafer chuck. A cooling liquid flows through the chuck cooling liquid path 27 from a cooling liquid source 28 via a supply path 29A and cools down the surface of the wafer chuck 18 that holds the wafer W. The cooling liquid having passed through the chuck cooling liquid path 27 is recovered to the cooling liquid source 28 via a recovery path 29B. Here, the portion constituted by the chuck cooling liquid path 27, the cooling liquid source 28, the supply path 29A, and the recovery path 29B is referred to as a chiller system. In addition, the heater 26 generates heat and heats the surface of the wafer chuck 18 that holds the wafer W. Further, a temperature sensor 41 is provided in the vicinity of the surface of the wafer chuck 18 and a control section 42 of the cooling liquid source 28 controls the temperature of the cooling liquid supplied from the cooling liquid source 28 in accordance with the surface temperature of the wafer chuck 18 detected by the temperature sensor 41.

Within the wafer chuck 18, a vacuum path for vacuum adsorption of the waver W, etc., is further provided, and there are various modification examples of the arrangement of the heater 26, the chuck cooling liquid path 27, and the vacuum path within the wafer chuck 18.

When conducting a probing test after the temperature of a wafer is adjusted to a predetermined temperature, the heater 26 or the chiller system is operated so that the wafer chuck 18 reaches the predetermined temperature and then the wafer is held thereon, and in a state in which the wafer W has reached the test temperature, the probing test is started. The wafer chuck 18 is made of a metal, such as aluminum, copper, etc., or a ceramic excellent in thermal conductivity.

The alignment method in a prober is described in, for example, Japanese Unexamined Patent Publication (Kokai) No. H5-343485, Japanese Unexamined Patent Publication (Kokai) No. H11-26520, etc., and the temperature adjustment mechanism of a wafer chuck is described in, for example, Japanese Unexamined Patent Publication (Kokai) No. 2001-210683 etc.

SUMMARY OF THE INVENTION

As described above, when the wafer W is subjected to a probing test at a high or low temperature, the wafer W is conveyed and held on the wafer chuck 18 in a state in which the temperature of the wafer chuck 18 is maintained at a predetermined temperature, however, the temperature of the wafer to be conveyed is almost the same as room temperature, and therefore, the temperature of the surface of the wafer chuck 18 changes under the influence thereof. The temperature sensor 41 is arranged near the surface of the wafer chuck 18, some distance therefrom, and therefore, the change in the surface temperature of the wafer chuck 18 on which the wafer 18 has been mounted is transferred to the temperature sensor 41 with time lag. In response to this, the control section 42 controls the wafer chuck 18 so that it is maintained at a predetermined temperature.

FIG. 3 is a diagram explaining the change in the surface temperature of the wafer W when the wafer W at room temperature is held on the wafer chuck 18 at a high temperature. If the wafer W at temperature T2 is held on the wafer chuck 18 at temperature T1 at a time indicated by P in the figure, the surface temperature of the wafer W rises rapidly and approaches the temperature of T1. The rising curve of the temperature begins with a steep slope at first, however, its slope gradually decreases. Consequently, it takes a long time for the temperature of the wafer W to reach the temperature T1.

For a probing test at a high or low temperature, a temperature range is specified. Because of this, for example, the set temperature T1 of the wafer chuck 18 is adjusted so that it is at a middle temperature of the temperature range and a probing test is started when the temperature of the wafer W reaches the lower limit (T1-$\Delta$T) of the temperature range or becomes higher. In addition, if the set temperature T1 of the wafer chuck 18 is adjusted to a temperature near the upper limit of the temperature range, it is possible to shorten the time required for the temperature of the wafer W to reach the lower limit of the temperature range.

In either case, it is suggested to carry out the wafer alignment operation in advance in order to start the probing test immediately when the temperature of the wafer W reaches the lower limit of the temperature range. However, even after wafer alignment is carried out, the temperature of the wafer W changes gradually, and therefore, a dimensional error occurs because the temperature of the wafer W when the wafer alignment operation has been carried out is different from that when the probing test is conducted, resulting in a difference in the contact position between the probe and the electrode, and there may be trouble with the inspection. For example, dies at both ends of a wafer having a diameter of 300 mm are approximately 300 mm apart from each other and the linear coefficient of expansion of a silicon wafer is about $3\times10^{-6}/°$C. near 100° C., and if the temperature changes two degrees, the shift will be about 1.8 μm.

In order to prevent such problems from occurring, one measure is to not carry out the wafer alignment operation until the temperature of the wafer W approaches the set temperature. Due to this, the dimensional error resulting from the change in the temperature of the wafer W is small because the change in the temperature between when the wafer alignment operation has been carried out and when the probing test is conducted is small. However, waiting for such a long period of time will lower the throughput of the prober and raise cost.

The present invention will solve these problems and an object thereof is to reduce the error in the contact position between a probe and an electrode without lowering throughput when a probing test of a wafer is conducted at a high or low temperature.

In order to attain the above-mentioned object, in the present invention, the wafer temperature changes after wafers at various temperatures are held on a wafer chuck and the temperature change data about the changes in dimension are stored in advance, and the temperature of the wafer before it is held on the wafer chuck is detected and the change in temperature after the wafer is held on the wafer chuck is predicted from the detected temperature of the wafer and the temperature change data, and then, the amount of movement is corrected in accordance with the predicted change in temperature.

In other words, the prober of the present invention is a prober that connects a probe to be connected to each terminal of a tester to the electrode of a device in order to inspect a plurality of devices formed on a wafer using the tester. The prober comprises a wafer chuck that holds a wafer, a movement mechanism that moves the wafer chuck, a temperature adjustment mechanism that sets the held wafer to a predetermined temperature by adjusting the temperature of the wafer chuck, an alignment means for measuring the positional relationship between the electrode of the device of the wafer held on the wafer chuck and the probe, and a movement control section that calculates the amount of movement to touch the electrode to the probe based on the positional relationship between the electrode and the probe measured by the alignment means and controls the movement mechanism based on the calculated amount of movement, wherein a wafer temperature sensor for detecting the temperature of the wafer before it is held on the wafer chuck is further provided and the movement control section comprises a temperature change data storage section that stores the wafer temperature change after the wafers at various temperatures are held on the wafer chuck and the data about the change in dimension, and a movement amount correction means for predicting the change in temperature after the wafer is held on the wafer chuck from the temperature of the wafer detected by the wafer temperature sensor and the data stored in the temperature change data storage section and correcting the calculated amount of movement in accordance with the predicted change in temperature when an inspection is made in a state in which the temperature of the wafer chuck is maintained at a high or low temperature.

In addition, a method for touching a probe to be connected to each terminal of a tester to an electrode of a device in order to inspect a plurality of devices formed on a wafer using the tester in the prober of the present invention comprises the steps of: storing in advance the wafer temperature change after wafers at various temperatures are held on the wafer chuck and temperature change data about the change in dimension; maintaining the temperature of the wafer chuck at a high or low set temperature; detecting the temperature of the wafer before it is held on the wafer chuck; measuring the positional relationship between the electrode of the device of the wafer held on the wafer chuck and the probe; calculating the amount of movement to touch the electrode to the probe based on the measured positional relationship between the electrode and the probe; predicting the change in temperature after the wafer is held on the wafer chuck from the detected temperature of the wafer and the temperature change data and correcting the calculated amount of movement in accordance with the predicted change in temperature; and moving the wafer chuck based on the corrected amount of movement.

According to the present invention, the change in the temperature of the wafer after it is held on the wafer chuck is predicted and the change in the dimension of the wafer in accordance with the change in the temperature of the wafer is predicted and then the amount of movement is corrected, and therefore, it is possible to reduce the error in the contact position between the probe and the electrode.

A wafer is thin and plate-shaped and its undersurface is comparatively similar, and therefore, if the condition is the same, it changes similarly. If the wafer temperature change after the wafers at various temperatures are held on the wafer chuck and the temperature change data about the change in dimension are measured and stored in advance for each condition, such as the wafer's thickness, diameter, material, etc., it is possible to accurately predict the change in temperature of a wafer. Specifically, how it changes differs depending on the condition, such as wafer's thickness, diameter, material, etc., and therefore, the temperature change data is measured and stored in advance about these conditions and combinations of the initial temperature of a wafer and the set temperature of the wafer chuck. When a silicon wafer of the same specifications is used, since the diameter and the material are the same, it is only necessary to measure and store the temperature change data in advance under the condition of wafer's thickness and to measure the thickness of the wafer and the temperature of the wafer before it is held, and thus the temperature of the wafer chuck is accurately maintained at a set temperature.

According to the present invention, when a probing test of a wafer is conducted at a high or low temperature, it is possible to reduce an error in the contact position between a probe and an electrode without lowering throughput.

BRIEF DESCRIPTION OF THE DRAWINGS

The features and advantages of the invention will be more clearly understood from the following description taken in conjunction with the accompanying drawings, in which:

FIG. 5 is a flow chart showing the operation of a prober in an embodiment.

PREFERRED EMBODIMENTS OF THE PRESENT INVENTION

Figure 1:
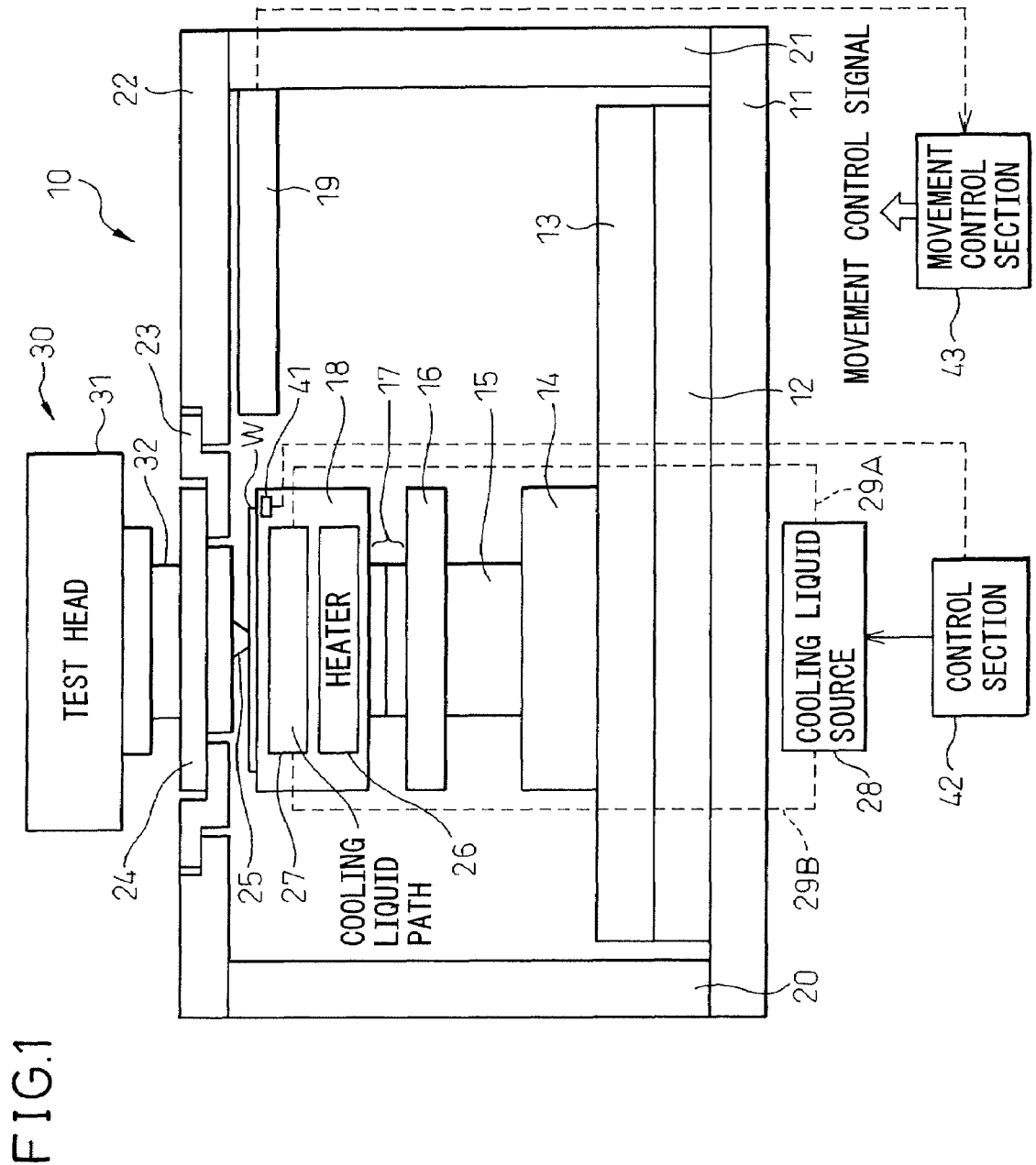
FIG. 1 is a diagram showing a general configuration of a wafer test system comprising a prober having a wafer temperature adjustment mechanism.
Figure 2:
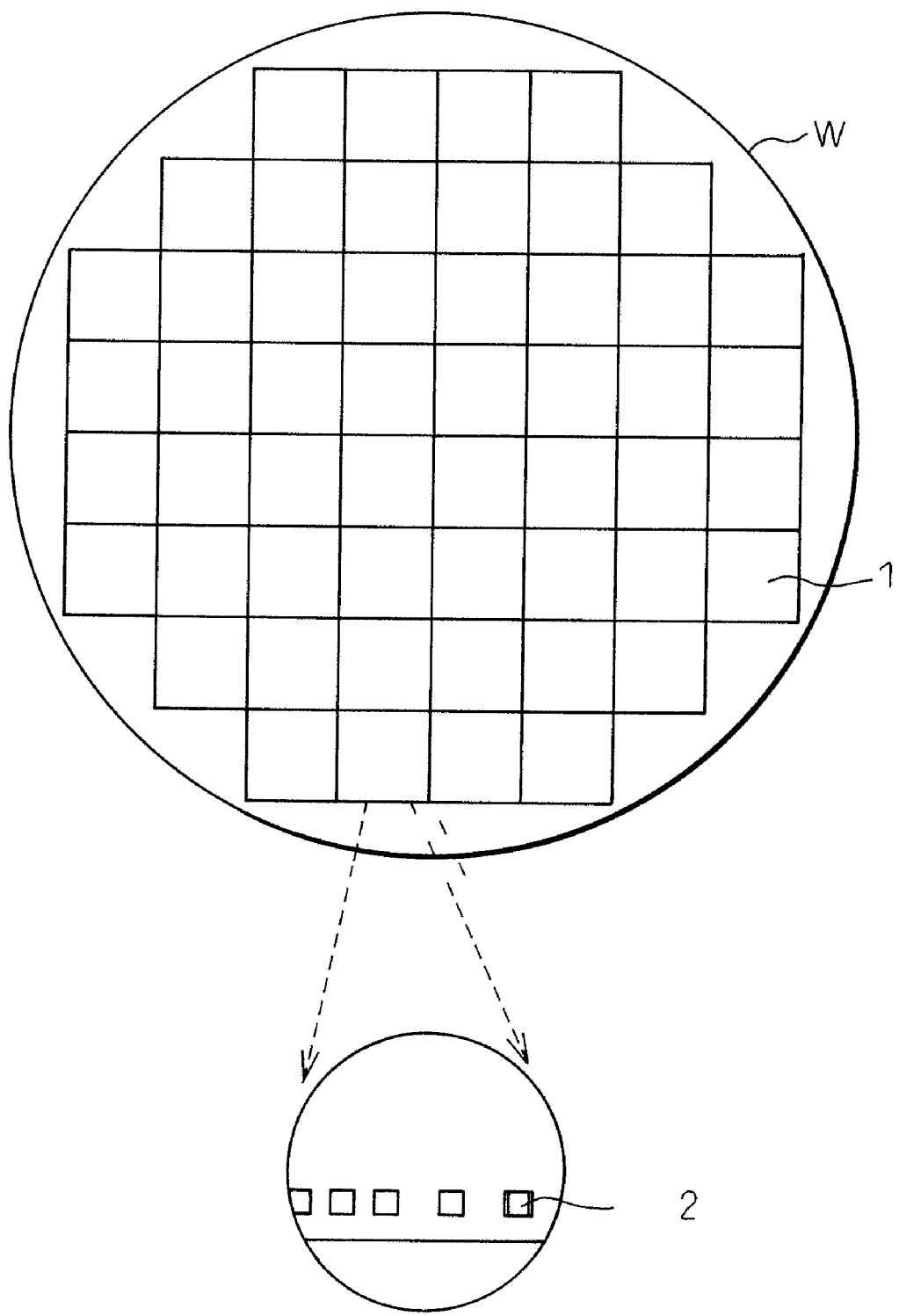
FIG. 2 is a diagram showing an array example of devices (dies) formed on a wafer.
Figure 3:
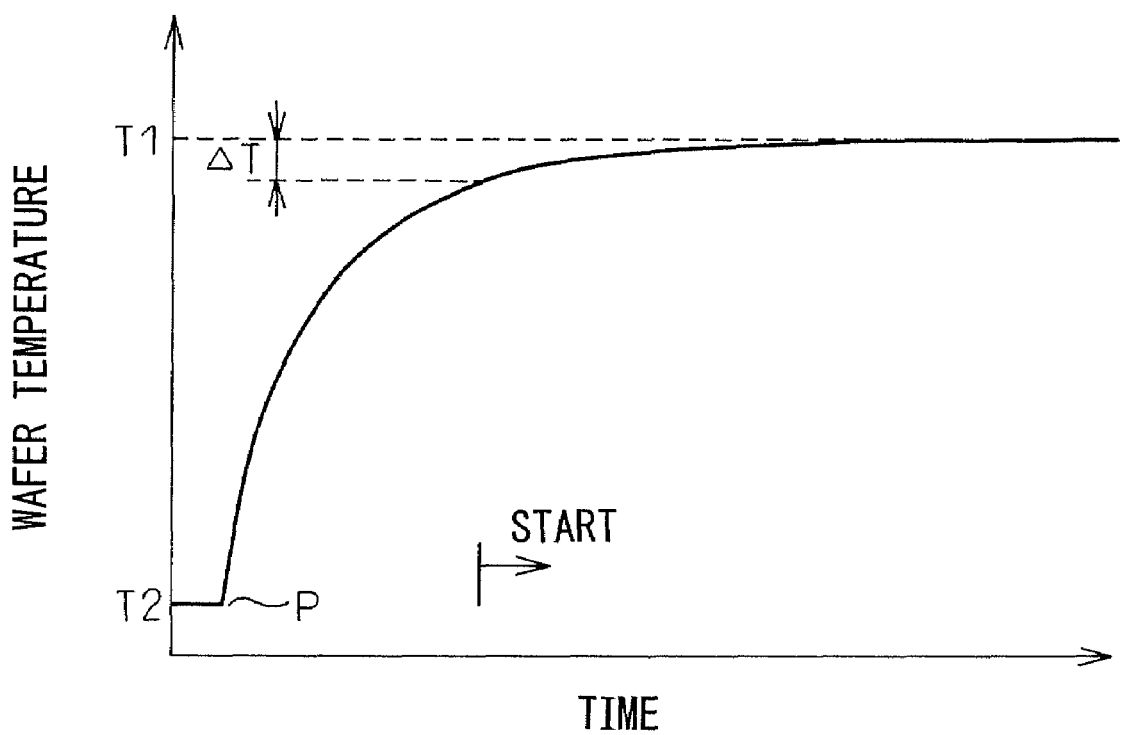
FIG. 3 is a diagram showing an example of a change in temperature of the surface of a wafer after the wafer at room temperature is held on a wafer chuck at a high temperature.
Figure 4:
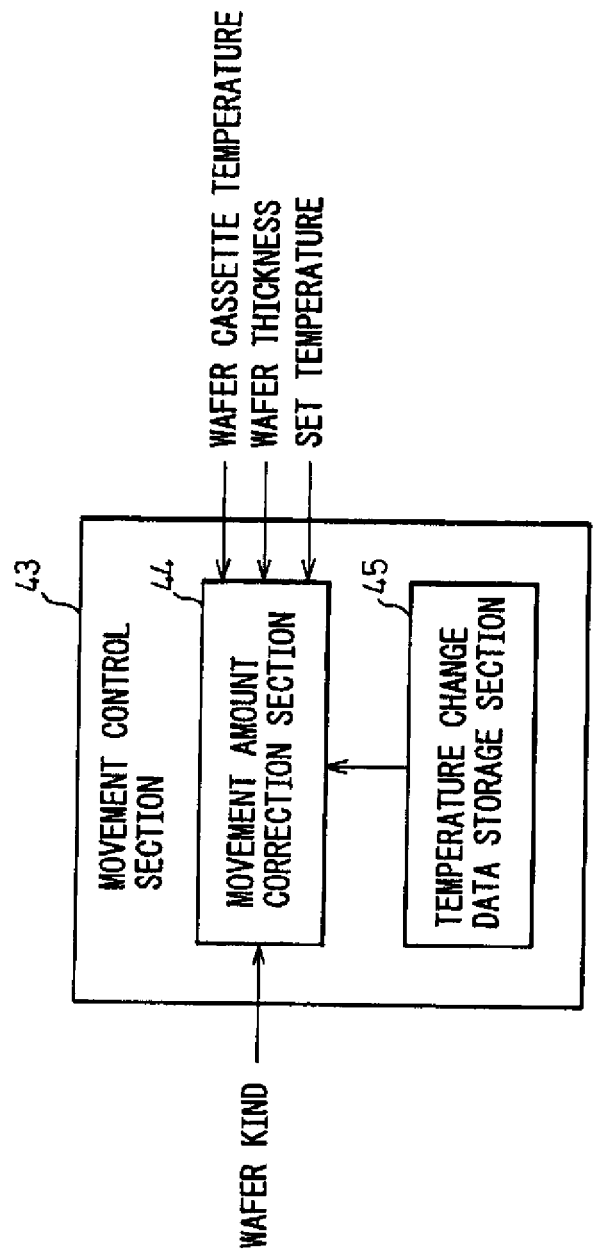
FIG. 4 is a diagram showing a configuration of a movement control section in an embodiment of the present invention.

The prober in an embodiment of the present invention has the same configuration as that in the conventional example shown in FIG. 1 and only the configuration of the movement control section 43 is different. FIG. 4 is a block diagram showing the configuration of the prober movement control section 43 in the embodiment of the present invention.

The prober movement control section 43 calculates an amount of movement to touch an electrode to a probe based on the result of alignment operation and carries out the conventional process to control the movement/rotation mechanism and at the same time, as shown in FIG. 4, the prober movement control section 43 has a movement amount correction section 44 and a temperature change data storage section 45 and corrects the amount of movement calculated by the conventional method.

The temperature change data storage section 45 stores temperature change data. The temperature change data includes the wafer temperature changes after the wafers at various temperatures are held on the wafer chucks at various set temperatures and changes in dimension of the wafer accompanying the temperature change, which are acquired experimentally and stored in the form of a table, for each condition, such as wafer's thickness, diameter, material, etc. A wafer is thin and plate-shaped, and its undersurface is comparatively similar, and therefore, if the condition is the same, it may change similarly. Conditions relating to how it changes may include the wafer's thickness, diameter, material, etc., and data about these conditions is experimentally acquired. If a silicon wafer of the same specifications is used, the diameter and the material are the same, and therefore, it is only necessary to consider the thickness of a wafer.

The temperature of a wafer generally changes so that it converges to the set temperature of the wafer chuck and that the temperature is uniquely determined if the initial temperature of the wafer and the set temperature are determined. Because of this, for each of the above-mentioned various conditions, the change in temperature is experimentally acquired for a combination of the initial temperature of the wafer and the set temperature of the wafer chuck and stored as temperature change data. Since the change in temperature of the wafer is in proportion to the difference between the temperature of the wafer and the set temperature at that point of time, it can be expressed by a hyperbola, and therefore it can also be expressed by a mathematical expression.

The thickness of a wafer differs between wafers having the same specifications, and therefore, the thickness needs to be known. The thickness can be known from a controller of a semiconductor production process, but the thickness is measured using a wafer thickness detector, not shown.

Although it is also possible to obtain the initial temperature immediately before the wafer is held on the wafer chuck by directly measuring the temperature of the wafer, here, the temperature of the wafer cassette is detected and is used as the initial temperature of the wafer on the assumption that the wafer is accommodated and supplied in the wafer cassette and the temperature of the wafer is the same as that of the wafer cassette, because a long time has elapsed since it was accommodated in the wafer cassette.

As the temperature of the wafer chuck is controlled so that it is accurately maintained at the set temperature, a control target temperature by the control section 42 is used as the set temperature.

The movement amount correction section 44 receives information about the kind of the wafer (diameter and material of the wafer), the thickness of the wafer, the temperature of the wafer cassette, and the set temperature from the outside and predicts the change in temperature after the wafer is held on the wafer chuck based on the data stored in the temperature change data storage section 45. Then, the movement amount correction section 44 corrects alignment data obtained by the same method as before and controls the movement/rotation mechanism so that the electrode of the wafer comes into contact with the prober based on the corrected alignment data.

FIG. 5 is a flow chart showing the temperature correction operation in the prober in the embodiment.

In step 101, the above-mentioned temperature change data is acquired experimentally and stored in the temperature change data storage section 45.

In step 102, the temperature of the wafer cassette is measured and stored as the initial temperature of the wafer.

In step 103, the wafer is taken out from the wafer cassette and conveyed on the wafer chuck and held, and from this point of time, the amount of time elapsed is timed.

In step 104, the thickness of the wafer held on the wafer chuck is measured and stored. It is also possible to carry out step 104 before the wafer is held on the wafer chuck.

In step 105, the alignment operation is carried out and the temperature of the wafer at this point of time is predicted and stored.

In step 106, the temperature of the wafer is predicted and whether the predicted temperature is within the allowable range of the inspection temperature is determined and the operation is not carried out until the temperature is within the allowable range.

Step 107 is carried out after the predicted temperature is within the allowable range, in which the probing position to which the die to be inspected is moved is calculated and the temperature of the wafer is further predicted. Then, the shift in position of the electrode on the wafer is calculated based on the difference between the predicted temperature and the predicted temperature at the time of the alignment operation and the probing position is corrected.

In step 108, the operation of touching the electrode to the probe is carried out based on the corrected probing position and probing operation (test) is carried out.

In step 109, whether the inspection of all the dies is finished is determined, and if not finished, the procedure returns to step 107 and steps 107 to 109 are repeated. The predicted temperature of the wafer is calculated in accordance with the amount of time elapsed during the repetition and the shift in position is corrected.

The present invention can be applied to a prober that inspects a wafer maintained at a high or low temperature and to a case where such a prober is used.

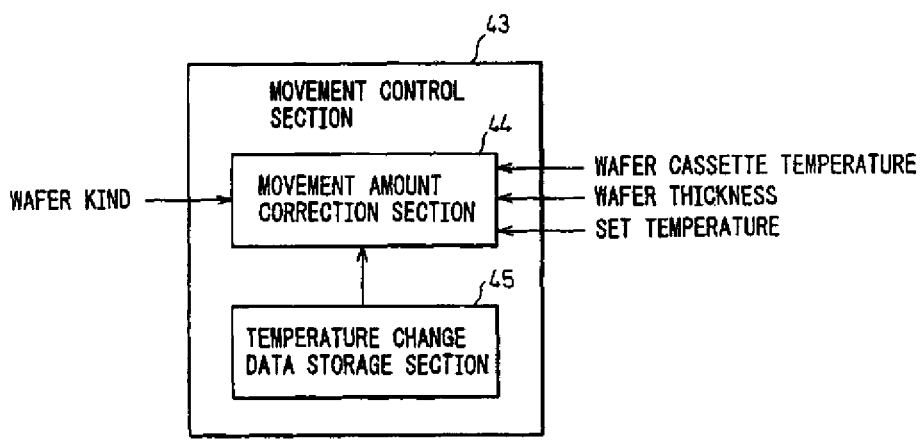

We claim:

1. A prober that connects a probe to be connected to each terminal of a tester to an electrode of a device to inspect a plurality of devices formed on a wafer using the tester, comprising:
    a wafer chuck that holds the wafer;
    a movement mechanism that moves the wafer chuck;
    a temperature adjustment mechanism that adjusts a temperature of the wafer chuck to maintain the held wafer at a predetermined temperature;
    an alignment means for measuring a positional relationship between the electrode of the device of the wafer held on the wafer chuck and the probe;
    a movement control section that calculates an amount of movement required to touch the electrode to the probe based on the positional relationship between the electrode and the probe measured by the alignment means and controls the movement mechanism based on the calculated amount of movement; and
    a wafer temperature sensor that detects a temperature of the wafer before it is held on the wafer chuck, wherein
    the movement control section comprises:
    a temperature change data storage section that stores in advance wafer temperature changes after wafers at various temperatures are held on the wafer chuck and data about the changes in dimension of respective wafers; and
    a movement amount correction means for predicting a change in temperature after the wafer is held on the wafer chuck from the temperature of the wafer detected by the wafer temperature sensor and the data stored in the temperature change data storage section, and corrects the calculated amount of movement in accordance with the predicted change in temperature when making an inspection while maintaining the temperature of the wafer chuck at a set temperature.

2. A method for touching a probe to be connected to each terminal of a tester to an electrode of a device to inspect a plurality of devices formed on a wafer in a prober using the tester, comprising the steps of:
    storing in advance wafer temperature changes after wafers at various temperatures are held on the wafer chuck, and temperature change data about the changes in dimension of respective wafers;
    maintaining a temperature of the wafer chuck at a set temperature;
    detecting a temperature of the wafer before it is held on the wafer chuck;
    measuring a positional relationship between the electrode of the device of the wafer held on the wafer chuck and the probe;
    calculating an amount of movement required to touch the electrode to the probe based on the measured positional relationship between the electrode and the probe;
    predicting a change in temperature after the wafer is held on the wafer chuck from the detected temperature of the wafer and the temperature change data and correcting the calculated amount of movement in accordance with the predicted change in temperature; and
    moving the wafer chuck based on the corrected amount of movement.

* * * * *

UNITED STATES PATENT AND TRADEMARK OFFICE
CERTIFICATE OF CORRECTION

PATENT NO.        : 7,492,176 B2
APPLICATION NO.   : 11/776516
DATED             : February 17, 2009
INVENTOR(S)       : Kiyotaka Chiba It is certified that error appears in the above-identified patent and that said Letters Patent is hereby corrected as shown below:

On the Title Page

The title page should be deleted and substitute therefore the attached title page

In the Drawings

FIG. 4, Sheet 4 of 5      Delete Drawing Sheet 4 and substitute therefore the Drawing Sheet, consisting of Fig. 4, as shown on the attached page Signed and Sealed this Thirteenth Day of October, 2009

David J. Kappos
*Director of the United States Patent and Trademark Office*

(12) United States Patent
Chiba et al.

(10) Patent No.: US 7,492,176 B2
(45) Date of Patent: Feb. 17, 2009

(54) PROBER AND PROBE CONTACT METHOD

(75) Inventors: Kiyotaka Chiba, Tokyo (JP); Fumio Mase, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 12 days.

(21) Appl. No.: 11/776,516

(22) Filed: Jul. 11, 2007

(65) Prior Publication Data
US 2008/0018352 A1    Jan. 24, 2008

(30) Foreign Application Priority Data
Jul. 20, 2006    (JP)  .................... 2006-197988

(51) Int. Cl.
*G01R 31/02*    (2006.01)
(52) U.S. Cl. ................ 324/758; 324/760; 324/765
(58) Field of Classification Search ............... None
See application file for complete search history.

(56) References Cited

U.S. PATENT DOCUMENTS 6,124,725 A *   9/2000   Sato ..................... 324/765

FOREIGN PATENT DOCUMENTS

| JP | 5-343485 | 12/1993 |
| JP | 11-26520 | 1/1999 |
| JP | 2001-210683 | 8/2001 |

OTHER PUBLICATIONS

Patent Abstracts of Japan, Publication No. 05-343485, Published on Dec. 24, 1993, in the name of Tsuta.
Patent Abstracts of Japan, Publication No. 11-026520, Published on Jan. 29, 1999, in the name of Akamatsu, et al.
Patent Abstracts of Japan, Publication No. 2001-210683, Published on Aug. 3, 2001, in the name of Chiba.

* cited by examiner

*Primary Examiner*—Vinh P Nguyen
(74) *Attorney, Agent, or Firm*—Christie, Parker & Hale, LLP

(57) ABSTRACT

A prober and a method for reducing errors in the contact position between a probe and an electrode without lowering throughput when conducting a test of a wafer at a high or low temperature. The prober includes a wafer chuck for holding a wafer, a movement mechanism for moving the wafer chuck, a temperature adjustment mechanism for adjusting the temperature of the wafer chuck to maintain the wafer at a predetermined temperature, an alignment mechanism for measuring a positional relationship between the electrode of the device of the wafer and the probe, a movement control section for calculating the amount of movement to touch the electrode to the probe based on the positional relationship between the electrode and the probe measured by the alignment mechanism and controlling the movement mechanism based on the calculated amount of movement and a wafer temperature sensor that detects the temperature of the wafer before it is held on the wafer chuck.

2 Claims, 5 Drawing Sheets